United States Patent
Borland et al.

(10) Patent No.: US 7,382,627 B2
(45) Date of Patent: Jun. 3, 2008

(54) CAPACITIVE/RESISTIVE DEVICES, ORGANIC DIELECTRIC LAMINATES AND PRINTED WIRING BOARDS INCORPORATING SUCH DEVICES, AND METHODS OF MAKING THEREOF

(75) Inventors: William J. Borland, Cary, NC (US); G. Sidney Cox, Durham, NC (US); David Ross McGregor, Apex, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 279 days.

(21) Appl. No.: 10/967,781

(22) Filed: Oct. 18, 2004

(65) Prior Publication Data

US 2006/0082982 A1   Apr. 20, 2006

(51) Int. Cl.
*H05K 1/18* (2006.01)
(52) U.S. Cl. ............... 361/763; 361/760; 361/761; 361/738; 361/793; 361/766; 361/811
(58) Field of Classification Search ........ 361/760–761, 361/763, 738, 793, 766, 811
See application file for complete search history.

(56) References Cited

U.S. PATENT DOCUMENTS

| | | | |
|---|---|---|---|
| 3,934,119 A | 1/1976 | Trenkler | |
| 4,377,652 A | 3/1983 | Ohmura et al. | |
| 4,399,417 A * | 8/1983 | Ballantyne et al. | 330/109 |
| 4,407,883 A | 10/1983 | Newton | |
| 4,410,867 A * | 10/1983 | Arcidiacono et al. | 333/172 |
| 4,508,766 A | 4/1985 | Inaike et al. | |
| 4,752,555 A * | 6/1988 | Takada et al. | 430/314 |
| 5,093,036 A | 3/1992 | Shafe et al. | |
| 5,172,304 A | 12/1992 | Ozawa et al. | |
| 5,284,899 A | 2/1994 | Morishige et al. | |
| 5,470,643 A | 11/1995 | Dorfman | |
| 5,699,224 A * | 12/1997 | Hanamura et al. | 361/313 |
| 5,731,747 A * | 3/1998 | Van De Walle et al. | 333/172 |
| 5,757,076 A * | 5/1998 | Kambara | 257/724 |
| 5,928,766 A * | 7/1999 | Hanamura | 428/209 |
| 6,030,553 A | 2/2000 | Huang et al. | |
| 6,111,005 A | 8/2000 | Dietz et al. | |
| 6,140,402 A | 10/2000 | Dietz et al. | |
| 6,150,456 A | 11/2000 | Lee et al. | |
| 6,197,222 B1 | 3/2001 | Saraf et al. | |
| 6,278,356 B1 * | 8/2001 | Lin et al. | 338/309 |
| 6,535,398 B1 * | 3/2003 | Moresco | 361/792 |

(Continued)

FOREIGN PATENT DOCUMENTS

EP    0918339 A2    5/1999

(Continued)

OTHER PUBLICATIONS

European Search Report, European Application No. 05020896, Date of Search Jan. 7, 2008.

*Primary Examiner*—Diego Gutierrez
*Assistant Examiner*—Hoa C Nguyen

(57) ABSTRACT

A capacitive/resistive device provides both resistive and capacitive functions. The capacitive/resistive device may be embedded within a layer of a printed wiring board. Embedding the capacitive/resistive device conserves board surface real estate, and reduces the number of solder connections, thereby increasing reliability. Conserves board surface real estate, and reduces the number of solder connections, thereby increasing reliability.

5 Claims, 4 Drawing Sheets

U.S. PATENT DOCUMENTS

| | | |
|---|---|---|
| 6,541,137 B1 | 4/2003 | Kingon et al. |
| 6,734,542 B2 * | 5/2004 | Nakatani et al. ............ 257/687 |
| 2003/0175411 A1 * | 9/2003 | Kodas et al. ................. 427/58 |
| 2004/0118600 A1 | 6/2004 | Lee et al. |
| 2004/0128822 A1 | 7/2004 | Tung |
| 2005/0224909 A1 * | 10/2005 | Yamaguchi et al. ........ 257/528 |

FOREIGN PATENT DOCUMENTS

| | | |
|---|---|---|
| EP | 1191555 A2 | 3/2002 |
| JP | 7-226302 | 8/1995 |
| WO | 9627210 A2 | 9/1996 |

\* cited by examiner

CAPACITIVE/RESISTIVE DEVICES, ORGANIC DIELECTRIC LAMINATES AND PRINTED WIRING BOARDS INCORPORATING SUCH DEVICES, AND METHODS OF MAKING THEREOF

TECHNICAL FIELD

The technical field relates to devices having both a capacitive and resistive functions, and methods of incorporating such devices in organic dielectric laminates and printed wiring boards.

RELATED ART

Capacitors and resistors may be used in series for transmission line termination of signal traces extending between integrated circuit (IC) devices. The capacitors and resistors are used to match the impedance of an IC device to a line, or to reduce or eliminate signal reflection. Some circuits are continuous load and use a resistor in parallel with the line. Non-continuous load circuits have a resistor and capacitor in series and are useful for low power ICs. FIG. 1 schematically illustrates a non-continuous load termination of IC devices 10 and 20 known in the prior art.

In FIG. 1, the distance from a to b is typically short. The value of the resistor R is chosen to match the line impedance and is typically about 45-80 ohms. The value of the capacitor C is chosen so that the RC time constant of the resistor R and the capacitor C in series is greater than the rise time of a signal and less than the total time of the signal pulse. Typical capacitance values are on the order of 30 picoFarads.

Conventional RC terminations are typically constructed of a surface mount technology (SMT) resistor and capacitor. FIG. 2 is a cross section view of a portion of a printed circuit board 25 having a SMT resistor 40 and a SMT capacitor 50 connected to an IC device 30 to form a conventional SMT RC transmission line termination for the IC 30. The signal line carrying the signal to the IC 30 is connected to a circuit trace 60 connecting the IC device 30 to the resistor 40. The capacitor 50 is coupled to a circuit trace 70 by one of a pair of solder pads 52 and solder joints 58. The resistor 40 is coupled to the circuit trace 70 by a solder pad 42 and a solder joint 48. The capacitor 50 is coupled to a via hole 80 by the other solder pad 58 and a circuit trace 59. This arrangement places the resistor 40 and the capacitor 50 in series with the signal line and connected to ground through a plated through-hole via 80. This conventional surface mount approach requires use of valuable surface real estate. Further, the requirement for solder joints reduces reliability and increases costs of fabrication.

SUMMARY

According to a first embodiment, a capacitive/resistive device comprises a first electrode, a dielectric disposed over the first electrode, a resistor element disposed over a second electrode and adjacent to the dielectric wherein the dielectric comprises a polymer filled with a high dielectric constant powder phase. The capacitive/resistive device can be embedded in organic dielectric laminates, and incorporated in printed wiring boards.

According to the above embodiment, both the resistor and the capacitor functions may be integrated into a single buried laminate, reducing the cost and difficulty in creating the resistor and capacitor functions. When the capacitive/resistive device is incorporated in a printed wiring board, embedding the capacitive/resistive device also frees up valuable real estate. Further, solder joints associated with SMT devices may be eliminated, thereby improving reliability. The capacitive/resistive device can be processed using conventional etching processes, further reducing production costs.

Those skilled in the art will appreciate the above stated advantages and other advantages and benefits of various additional embodiments of the invention upon reading the following detailed description of the embodiments.

BRIEF DESCRIPTION OF THE DRAWINGS

The detailed description will refer to the following drawings, wherein like numerals refer to like elements, and wherein.

DETAILED DESCRIPTION

Embodiments of the present invention are addressed to capacitive/resistive devices that may be buried in the substrate of a printed wiring board (PWB). Providing the capacitive and resistive functions within the PWB substrate conserves valuable surface real estate on the printed wiring board. The embodiments of the present invention also require fewer solder joints than conventional SMT termination arrangements.

Figure 1:
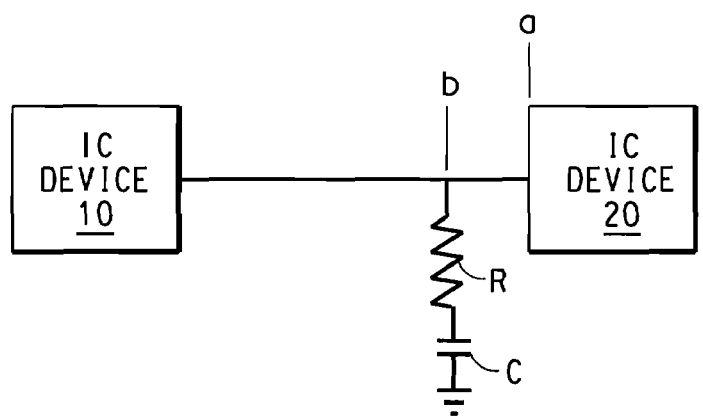
FIG. 1 is a schematic illustration of a conventional (prior art) non-continuous load termination having a resistor and capacitor in series.
Figure 2:
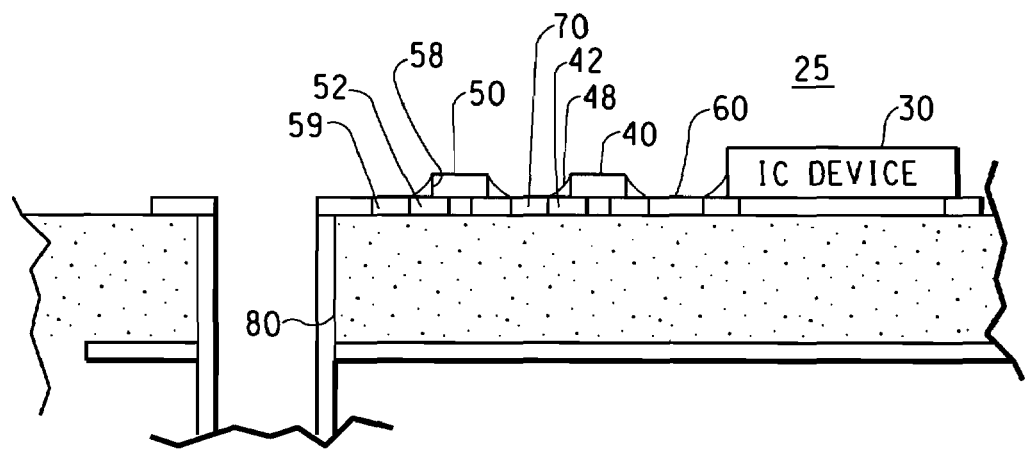
FIG. 2 is a cross section view of a printed wiring board having a conventional (prior art) SMT RC transmission line termination for an integrated circuit device.
Figure 3:
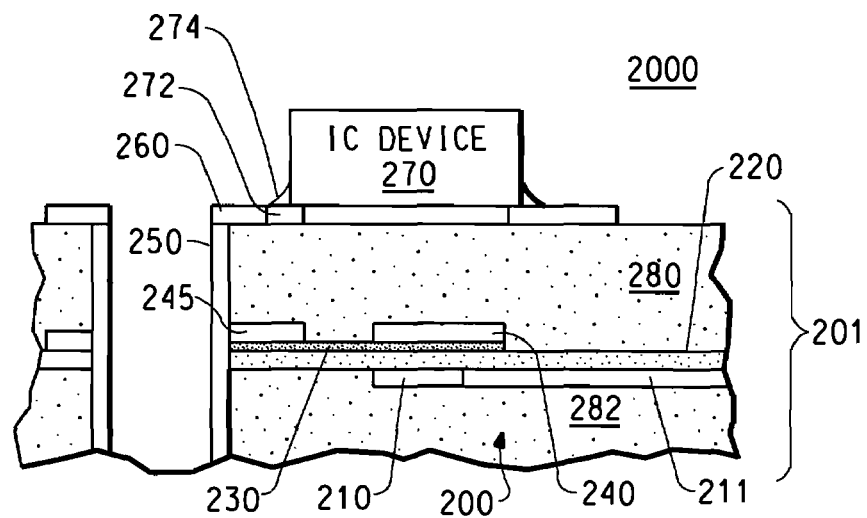
FIG. 3 is a section view of a portion of a printed wiring board having an embedded capacitive/resistive device according to a second embodiment.

FIG. 3 is a section view of a portion of a printed wiring board 2000. The printed wiring board section 2000 includes an RC transmission line termination in which the resistor function and the capacitor function are integrated into a single capacitive/resistive device 200. The device 200 comprises a bottom electrode 210, a dielectric 220, a resistor element 230, a top electrode or top plate 240, and a conductive trace 245. The device 200 provides a resistive and a capacitive function in a single laminate structure, generally indicated by the bracket 201. The device 200 is coupled to an IC device 270 by the conductive circuit trace 245, a plated through hole via 250 extending through a dielectric layer 280, and a conductive circuit trace 260. The IC device 270 may be connected to the conductive circuit trace 260 by a solder pad 272 and a solder joint 274. A conductive circuit trace 211 may extend from the bottom electrode 210 for connection to ground or other circuitry.

Figure 4A:
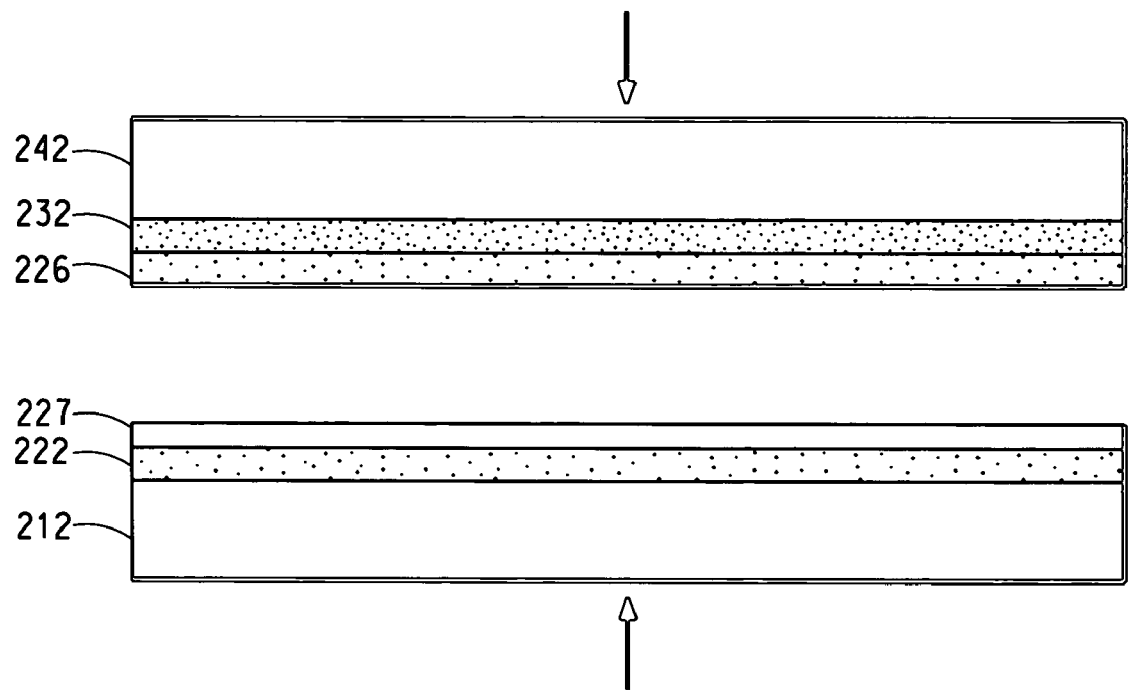
FIGS. 4A-4F illustrate a method according to the present invention of making a laminate structure including the capacitive/resistive device illustrated in FIG. 3.

FIGS. 4A-4F illustrate a method of making a laminate including the device 200. FIG. 4A is a section view in front elevation of a first stage of manufacture in which first and second metallic foils 212, 242 are provided. The second metallic foil 242 is provided with a layer of resistor material 232. The resistor material 232 can be, for example, NiP, CrSi, NiCr or other electrically resistive materials that can be plated, sputtered or otherwise deposited over the surface of the second metallic foil 242. The first and second metallic foils 212, 242 can be made from, for example, copper, copper-based materials, and other metals.

A high dielectric constant slurry may be cast or coated onto the first foil 212 and cured, forming a first dielectric layer 222. A similar, second dielectric layer 226 may be formed in a similar manner on the second foil 242, over the surface of the layer of resistor material 232. Slurry materials may comprise, for example, a polymer-solvent solution with a high dielectric constant ("high K") filler or functional phase. Suitable polymers for slurry or solution may include, for example, epoxies or polyimide resins. High K functional phases may be defined as materials with dielectric constants of greater than 500 and may include perovskites of the general formula $ABO_3$. Suitable fillers include, for example, crystalline barium titanate (BT), barium strontium titanate (BST), lead zirconate titanate (PZT), lead lanthanum titanate, lead lanthanum zirconate titanate (PLZT), lead magnesium niobate (PMN), and calcium copper titanate and mixtures thereof. Fillers may be in powder form.

A thin adhesive layer 227 may be applied to one or both surfaces of either of the dielectric layers 222, 226 (shown in FIG. 4A on the layer 222). The adhesive layer 227 may be formed from, for example, a thermoplastic polymer and may be filled with a high dielectric phase to avoid dilution of the dielectric constant. The two structures are then laminated together in the direction of the arrows shown in FIG. 4A.

Figure 4B:
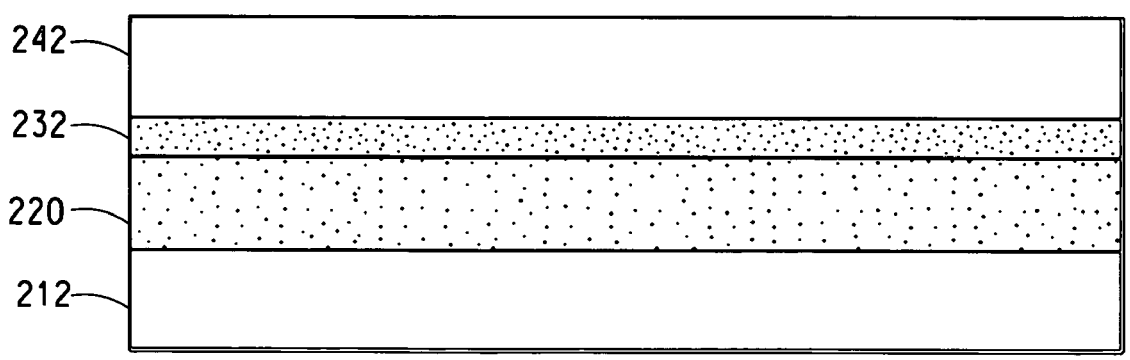

Referring to FIG. 4B, lamination forms a single dielectric 220 from the layers 222, 226 and 227. This dielectric layer may have a dielectric constant in the range of 5 to 40. The adhesive layer 227 facilitates joining of the dielectric layers 222 and 226 during the lamination process. The adhesive layer 227, however, may be dispensed with if the dielectric layers 222 and 226 are only partially cured prior to lamination, or, are of a thermoplastic nature so that upon lamination a suitable temperature and pressure will sufficiently soften the resin so that the layers 224 and 226 bond without adhesive. The structure shown in FIG. 4B may also be formed by casting a slurry onto only one of the foils 212, 242 and laminating the other foil to the cured or partially cured slurry. Yet another alternative method would be to form a free-standing film of the cured or partially cured slurry 220 and laminate foils 212 and 242 to both sides of the polymer film 220.

Figure 4C:
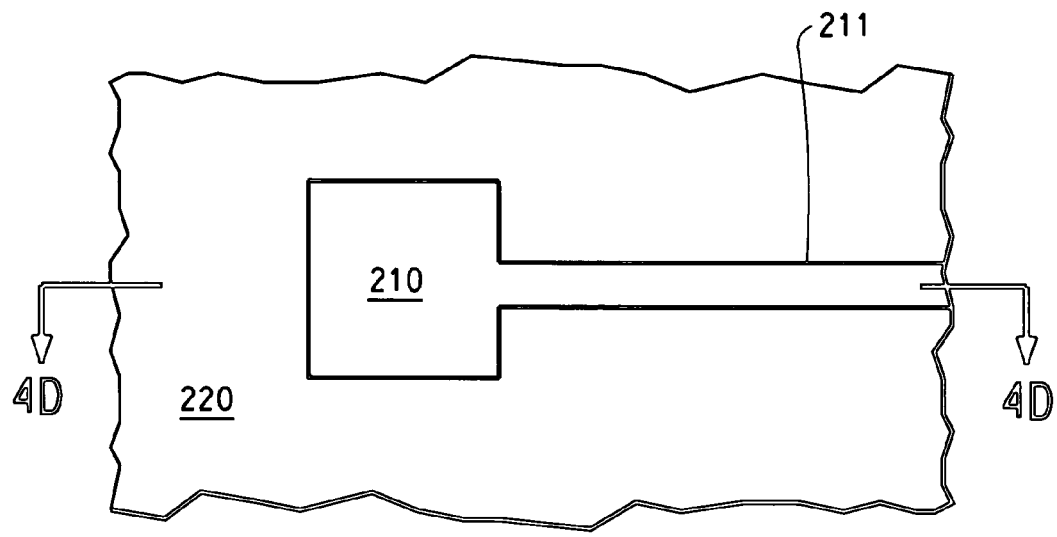

A photoresist (not shown in FIG. 4B) is applied to the foil 212 and the foil 212 is imaged and etched, and the remaining photoresist stripped using standard printing wiring board processing conditions. FIG. 4C is a bottom section view of the resulting article, taken on line 4C-4C in FIG. 4D. Referring to FIG. 4C, the etching produces the bottom electrode 210 of the device 200 and the conductive circuit trace 211.

Figure 4D:
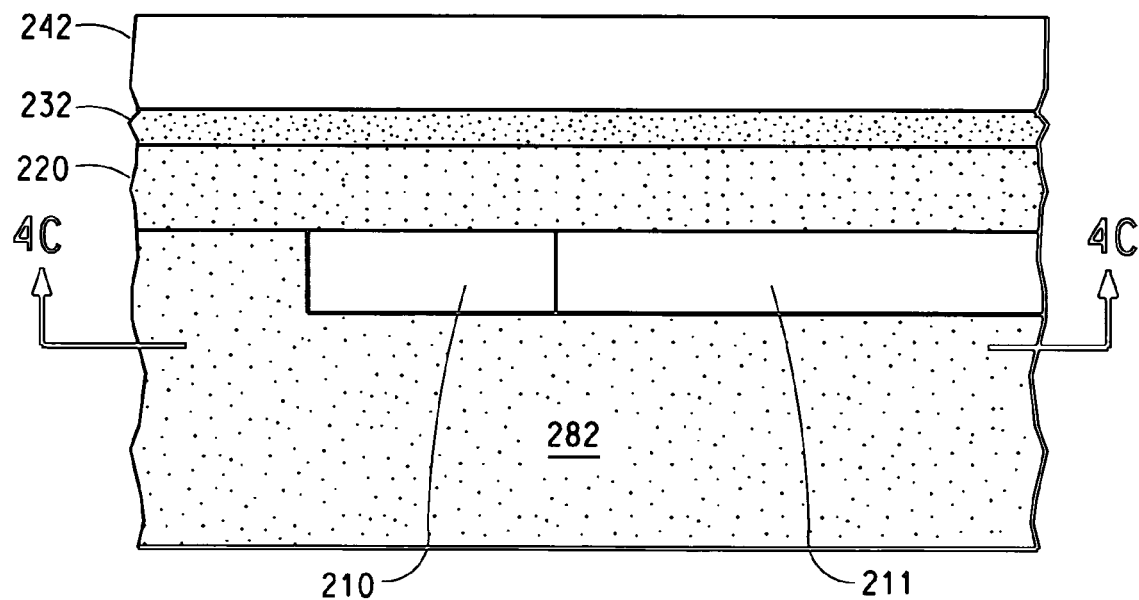

FIG. 4D is a section view in front elevation taken on line 4D-4D in FIG. 4C. Referring to FIG. 4D, the bottom electrode 210 side of the resulting article is laminated to a laminate material 282. The lamination can be performed, for example, using FR4 prepreg, or other prepregs, in standard printing wiring board processes.

Figure 4E:
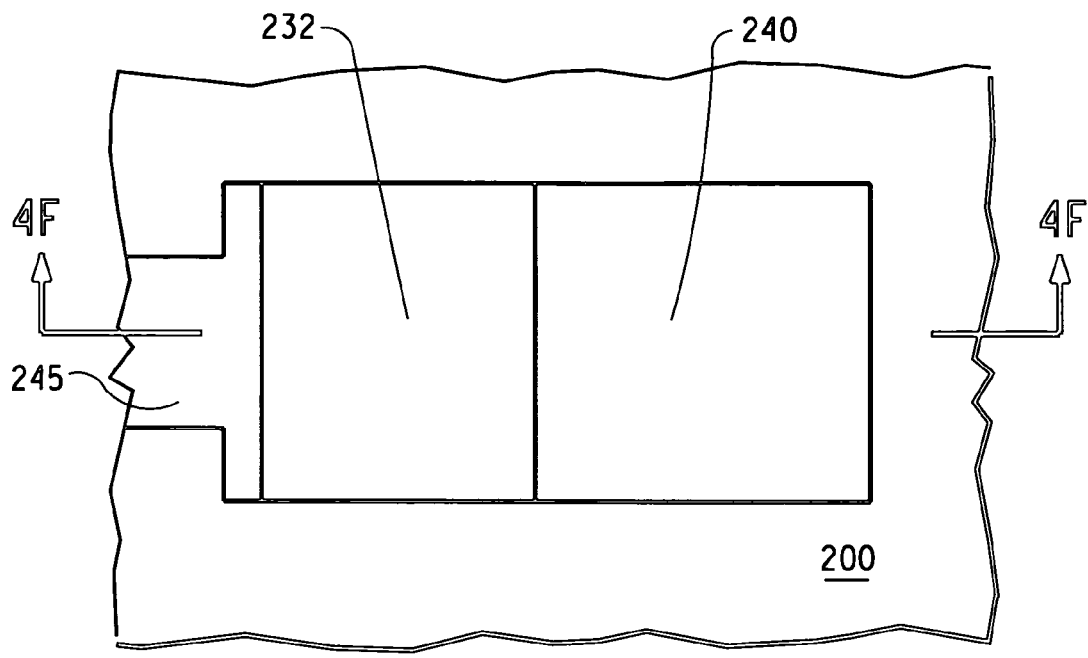
Figure 4F:
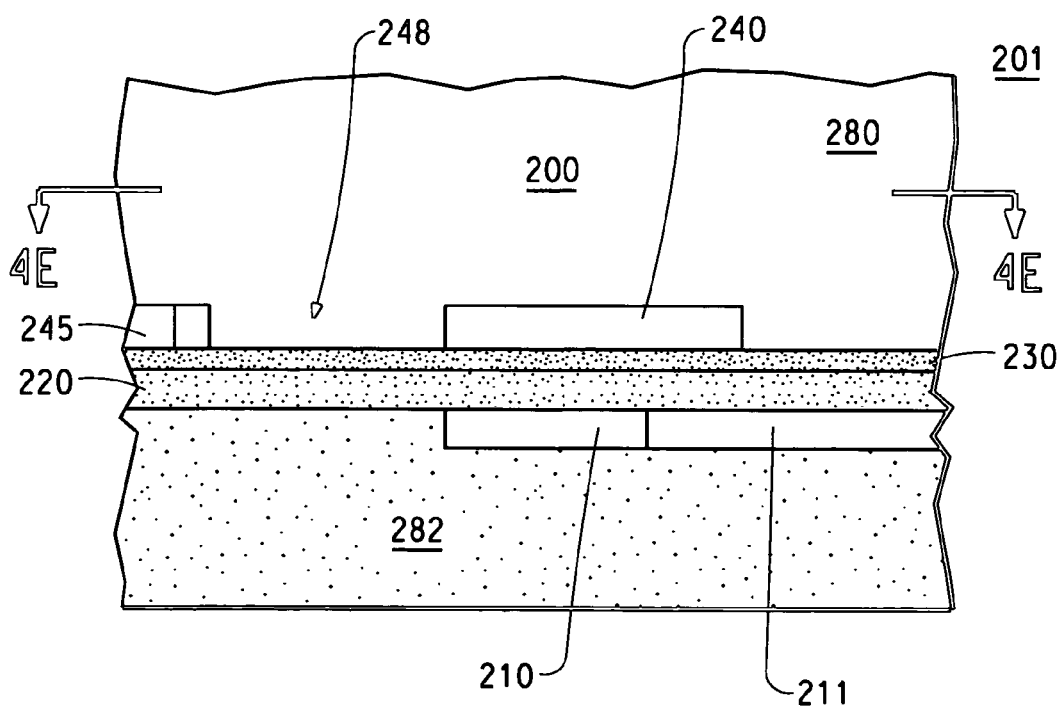

A photoresist (not shown in FIG. 4D) is applied to the foil 242 and the foil 242 is imaged and etched, and the remaining photoresist stripped. FIG. 4E is a top section view of the resulting article, taken on line 4E-4E in FIG. 4F. FIG. 4F is a section view in front elevation, taken on line 4F-4F in FIG. 4E. Referring to FIGS. 4E and 4F, the etching produces the top electrode 240 of the device 200 and the conductive circuit trace 245. Etching also produces a gap 248.

A photoresist (not shown in FIGS. 4E and 4F) may be re-applied and the resistor material 232 may be imaged and etched using etching solutions that remove resistor material. In this way, the layer of resistor material 232 can be selectively etched to form a resistor element 230 having any desired shape and dimensions. The resultant resistor element 230 bridges the gap 248 and extends between the top conductor 240 and the conductive trace 245.

Referring to FIG. 4F, a dielectric layer 280 is laminated to the component side of the dielectric layer 282, forming a laminate structure 201. The laminate structure 201 can then be incorporated into, for example, a printed wiring board using conventional lamination and via formation processes.

EXAMPLE 1

This example of the device 200 is discussed with reference to FIG. 3. In this example, the initial laminate structure shown in FIG. 4B, consists of copper foil 242 plated with a resistive material 232 that is composed of a nickel phosphorus alloy of sheet resistivity 50 ohms per square. The dielectric 220 is a barium titanate-filled thermoplastic polyimide. Barium titanate is advantageous as a filler as it is readily available and lead-free. The dielectric 220 is 14 microns thick and has a dielectric constant of 11, thereby yielding a capacitance density of 4.5 nanoFarads per square inch.

The size (when viewed from a top plan perspective) of the capacitor needed for a transmission line termination of 30 picoFarad is 4.3 square mm, or approximately 2 mm by 2 mm. Electrodes 210 and 240 are formed from etching copper foils 212 and 242. The above capacitor is easy to make to relatively high tolerances.

The size of the resistor in this example for a nominal 60 ohm resistance can be varied, as long as the length to width ratio is maintained at 1.2 to 1.0.

EXAMPLE 2

This example of the device 200 is discussed with reference to FIG. 3. In this example, the initial laminate structure shown in FIG. 4B, consists of copper foil 242 plated with a resistive material 232 that is composed of a nickel phosphorus alloy of sheet resistivity 50 ohms per square. The dielectric 220 is a barium titanate-filled thermoplastic polyimide. Barium titanate is advantageous as a filler as it is readily available and lead-free. The dielectric 220 is 8 microns thick and has a dielectric constant of 11, thereby yielding a capacitance density of 6.2 nanoFarads per square inch.

The size (when viewed from a top plan perspective) of the capacitor needed for a transmission line termination of 30 picoFarad is 3.1 square mm, or approximately 1.77 mm by 1.77 mm. Electrodes 210 and 240 are formed from etching copper foils 212 and 242. The above capacitor is easy to make to relatively high tolerances.

The size of the resistor in this example for a nominal 60 ohm resistance can be varied, as long as the length to width ratio is maintained at 1.2 to 1.0.

According to the above embodiment, thin high dielectric constant capacitor laminate structures in combination with resistors may be used to reduce the size of the buried capacitor function and to more effectively bury RC transmission line terminations. Embedding the capacitor and resistor functions frees up valuable board surface real estate and eliminates solder joints associated with SMT devices, thereby improving reliability. Further, the laminates combining resistance and capacitance within the laminate can be processed using conventional etching processes, which reduces production costs.

The above embodiments also provide other options for circuit designers and PWB fabricators. For example, one piece of laminate can be used to embed many discrete resistors and many discrete capacitors, which reduces the inductance associated with connecting resistors and capacitors.

The shapes of the capacitor embodiments in top plan view are generally rectangular. However, the capacitor electrodes, dielectrics, and other components and layers can have other regular or irregular surface area shapes, such as, for example, round, oblong, oval or polygonal shapes.

A single capacitive/resistive device 200 is formed in each of the laminate structures 201 described above. However, panel structures and printed wiring boards can include a large number of individual capacitive/resistive devices of differing type and arrangement.

In the above embodiments, resistance, capacitance and inductance combine to create a specific circuit impedance, typically identified by the capital letter Z. The resistance and capacitance may be structured to achieve a specific impedance. Changing the resistance, capacitance, or both will change the inductance. All three changes can be controlled to define the final impedance. In other words, the impedance of the laminate is 'tunable.'

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

The invention claimed is:

1. A laminate structure comprising a capacitive/resistive device, comprising:
   a first metal foil;
   a dielectric disposed over the first metal foil;
   a second metal foil;
   a resistive layer having two opposing surfaces and disposed over the second metal foil;
   wherein one surface of the resistive layer contacts the dielectric layer;
   a first electrode formed by etching the first metal foil;
   a second electrode and a conductive trace separately formed by etching the second metal foil;
   the first electrode, the dielectric layer, and the second electrode forming a capacitor;
   wherein at least a portion of the opposite surface of the resistive layer contacts both the second electrode and the conductive trace, thereby forming a resistor element;
   wherein the resistor element contacts the dielectric layer,
   wherein the dielectric comprises a polymer filled with a high dielectric constant powder phase;
   wherein the dielectric layer is 8-25 micrometers in thickness with a dielectric constant of between 5 and 40, and
   wherein the dialectic layer is formed by casting a dielectric slurry comprising the polymer, a solvent, and the high dielectric constant powder phase over the first metal foil, the second metal foil, or over the first metal foil and the second metal foil; and
   wherein the capacitor and resistor are laminated to, and embedded within, at least two printed wiring board dielectric laminate layers.

2. The capacitive/resistive device of claim 1, wherein the resistive layer is disposed between the dielectric and the second electrode.

3. The capacitive/resistive device of claim 1 wherein said dielectric comprises polyimide polymer.

4. The capacitive/resistive device of claim 1 wherein said high dielectric constant powder phase is selected from barium titanate, barium strontium titanate, lead zirconate titanate, lead lanthanium zirconate titanate, lead magnesium titanate, calcium copper titanate, and mixtures thereof.

5. A printed wiring board, comprising:
   at least one laminate structure according to claim 1; and
   at least one IC device disposed on a top surface of the printed wiring board,
   wherein the IC device is electrically coupled to the capacitive/resistive device.

* * * * *